United States Patent
Lim et al.

(10) Patent No.: US 11,003,077 B2
(45) Date of Patent: May 11, 2021

(54) POSITIVE PHOTORESIST COMPOSITION, PHOTORESIST PATTERN USING THE SAME, AND MANUFACTURING METHOD OF THE PHOTORESIST PATTERN

(71) Applicant: LG CHEM, LTD., Seoul (KR)

(72) Inventors: Min Young Lim, Daejeon (KR); Tae Seob Lee, Daejeon (KR); Ji Hye Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 87 days.

(21) Appl. No.: 16/091,263

(22) PCT Filed: Mar. 16, 2018

(86) PCT No.: PCT/KR2018/003111
§ 371 (c)(1),
(2) Date: Oct. 4, 2018

(87) PCT Pub. No.: WO2019/009499
PCT Pub. Date: Jan. 10, 2019

(65) Prior Publication Data
US 2019/0146338 A1   May 16, 2019

(30) Foreign Application Priority Data

Jul. 4, 2017   (KR) ........................ 10-2017-0085011

(51) Int. Cl.
| | | |
|---|---|---|
| *G03F 7/033* | (2006.01) | |
| *G03F 7/004* | (2006.01) | |
| *G03F 7/20* | (2006.01) | |
| *C08L 25/18* | (2006.01) | |
| *C08L 9/06* | (2006.01) | |
| *C08L 33/14* | (2006.01) | |
| *C08F 220/20* | (2006.01) | |
| *C08F 220/30* | (2006.01) | |
| *G03F 7/039* | (2006.01) | |
| *C08F 220/40* | (2006.01) | |
| *C08K 5/41* | (2006.01) | |
| *C08K 5/17* | (2006.01) | |

(52) U.S. Cl.
CPC ............ *G03F 7/033* (2013.01); *C08F 220/20* (2013.01); *C08F 220/30* (2013.01); *C08F 220/40* (2013.01); *C08L 9/06* (2013.01); *C08L 25/18* (2013.01); *C08L 33/14* (2013.01); *G03F 7/0045* (2013.01); *G03F 7/0392* (2013.01); *G03F 7/0397* (2013.01); *G03F 7/2059* (2013.01); *C08K 5/17* (2013.01); *C08K 5/41* (2013.01)

(58) Field of Classification Search
CPC ...... G03F 7/0045; G03F 7/033; G03F 7/0392; G03F 7/0397; G03F 7/2059; C08F 220/20; C08F 220/30; C08F 220/40; C08L 9/06; C08L 25/18; C08L 33/14; C08K 5/17; C08K 5/41
See application file for complete search history.

(56) References Cited

U.S. PATENT DOCUMENTS

| | | | | |
|---|---|---|---|---|
| 5,962,180 | A  * | 10/1999 | Iwanaga | ............... G03F 7/0045 430/170 |
| 6,228,661 | B1 * | 5/2001 | Li | ....................... G03F 7/70558 216/59 |
| 6,365,321 | B1 | 4/2002 | Chen et al. | |
| 2001/0008739 | A1* | 7/2001 | Nishiyama | ............ G03F 7/0048 430/176 |
| 2004/0038148 | A1 | 2/2004 | Ohta et al. | |
| 2006/0063371 | A1* | 3/2006 | Lin | ..................... H01L 23/5329 438/618 |
| 2006/0210921 | A1 | 9/2006 | Watanabe | |
| 2007/0190465 | A1 | 8/2007 | Nishikawa et al. | |
| 2011/0117332 | A1 | 5/2011 | Seong et al. | |
| 2011/0294070 | A1 | 12/2011 | Hatakeyama et al. | |
| 2012/0015299 | A1* | 1/2012 | Komuro | ................ G03F 7/0382 430/285.1 |
| 2013/0071788 | A1 | 3/2013 | Hatakeyama et al. | |
| 2013/0095429 | A1 | 4/2013 | Iizuka et al. | |
| 2015/0125794 | A1 | 5/2015 | Hatakeyama et al. | |
| 2015/0355543 | A1 | 12/2015 | Takemura et al. | |
| 2016/0229940 | A1 | 8/2016 | Hatakeyama et al. | |
| 2017/0031243 | A1 | 2/2017 | Hatakeyama et al. | |

FOREIGN PATENT DOCUMENTS

| | | | |
|---|---|---|---|
| JP | 09-202811 | A | 8/1997 |
| JP | 2001-281862 | A | 10/2001 |
| JP | 2001-281863 | A | 10/2001 |
| JP | 2006-258980 | A | 9/2006 |
| JP | 2006-308612 | A | 11/2006 |
| JP | 2008-258479 | A | 10/2008 |
| JP | 2008-268741 |   * | 11/2008 |
| JP | 2012-012577 | A | 1/2012 |
| JP | 2013-076990 | A | 4/2013 |
| JP | 2015-117305 | A | 6/2015 |
| JP | 2015-215452 | A | 12/2015 |
| JP | 2016-090667 | A | 5/2016 |
| JP | 2017-026980 | A | 2/2017 |
| JP | 2017-032716 | A | 2/2017 |
| KR | 10-1999-0085504 | A | 9/2000 |
| KR | 10-2007-0007152 | A | 1/2007 |

(Continued)

OTHER PUBLICATIONS

Machine translation of JP2008-268741, published on Nov. 6, 2008 (Year: 2008).*

(Continued)

*Primary Examiner* — Anca Eoff

(74) *Attorney, Agent, or Firm* — Rothwell, Figg, Ernst & Manbeck, P.C.

(57) ABSTRACT

The present invention relates to a positive photoresist composition including an acrylic resin including a repeat unit of a specific structure, and a photosensitive acid-generating compound, a photoresist pattern using the same, and a method for manufacturing a pattern.

18 Claims, No Drawings

(56) References Cited

FOREIGN PATENT DOCUMENTS

| KR | 10-2011-0048479 A | 5/2011 |
| KR | 10-2015-0051885 A | 5/2015 |
| KR | 10-2015-0141159 A | 12/2015 |
| TW | 201634498 A | 10/2016 |

OTHER PUBLICATIONS

International Search Report and Written Opinion issued for PCT/KR2018/003111 dated Jul. 30, 2018, 10 pages.

\* cited by examiner

POSITIVE PHOTORESIST COMPOSITION, PHOTORESIST PATTERN USING THE SAME, AND MANUFACTURING METHOD OF THE PHOTORESIST PATTERN

CROSS-REFERENCE TO RELATED APPLICATION(S)

This application is a 35 U.S.C. § 371 National Phase Entry Application from PCT/KR2018/003111, filed on Mar. 16, 2018, and designating the United States, which claims the benefit of Korean Patent Application No. 10-2017-0085011 filed on Jul. 4, 2017 with the Korean Intellectual Property Office, the disclosures of which are herein incorporated by reference in their entirety.

TECHNICAL FIELD

Background of Art

With the development of personal portable electronic products such as a mobile phone, a notebook, a PDA, an IC card, etc., for miniaturization and weight reduction of the products, the electronics industry has sought a method that is capable of reducing the pitch size of a semiconductor package, and a size of a connection terminal, referred to as a bump, that can be directly connected with a chip is used in a semiconductor chip in a wire method of the existing packaging process.

This is the next generation process for forming an external connection terminal of a 5 to 10 μm size with a material such as gold or solder on an aluminum pad of a wafer, and unlike the existing wire bonding method, turns a chip on which a bump is formed over and mounts it such that the flipped surface faces the substrate, and it is a technology that is capable of realizing the smallest form of semiconductor packaging.

A bump may be formed, for example, by forming a thick film photoresist layer with a thickness of about 10 to 100 μm on a substrate, exposing it through a predetermined mask pattern and developing it to form a resist pattern in which a part forming a bump is selectively removed (stripped), filling the removed part (non-resist part) with a conductor such as copper by plating, and then removing the resist pattern around it.

As a photoresist for a thick film, as in Japanese Patent Laid-Open Publication No. 2008-258479, a positive photosensitive resin composition including a quinone diazide group-containing compound that is used for the formation of a bump or wiring has been disclosed. Meanwhile, as a photosensitive resin composition with higher sensitivity than the existing positive photosensitive resin composition including a quinone diazide group-containing compound, a chemical amplification type of photoresist including an acid generator is known.

The chemical amplification type of photoresist is characterized in that an acid is generated from the acid generator by irradiation (exposure), and thus acid diffusion is promoted by heating after exposure, and an acid catalyzed reaction is caused for the base resin, etc. in the resin composition, thereby changing the alkali solubility. For example, as can be seen in Japanese Laid-Open Patent Publication No. 2001-281862 and Japanese Laid-Open Patent Publication No. 2001-281863, etc., among the chemical amplification type of photoresist, as a positive photoresist that becomes alkali-soluble from alkali-insoluble, chemical amplification types of photoresist compositions for plating are disclosed.

DETAILED DESCRIPTION OF THE INVENTION

Technical Problem

It is an object of the present invention to provide a positive photoresist composition having excellent storage stability, sensitivity, developability, resistance to a plating solution, and heat resistance.

It is another object of the present invention to provide a photoresist pattern of a thick film manufactured from the above composition, and a method for manufacturing a pattern.

Technical Solution

According to one embodiment of the present invention, a positive photoresist composition including an acrylic resin including a repeat unit of the following Chemical Formula 1, and a photosensitive acid-generating compound, is provided.

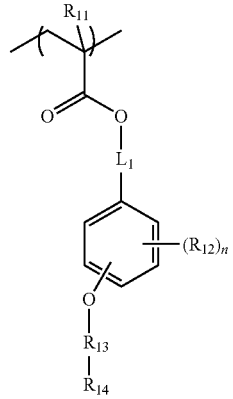

[Chemical Formula 1]

In Chemical Formula 1, $R_{11}$ and $R_{12}$ are each independently hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl including one or more heteroatoms selected from the group consisting of N, O, and S, n is 0 to 3, $R_{13}$ is a $C_2$~$C_8$ linear or branched alkylene, $R_{14}$ is a vinyl group or a (meth)acrylate group, and $L_1$ is a direct bond; a $C_1$~$C_{20}$ alkylene; a substituted or unsubstituted $C_{6-60}$ arylene; or a $C_{2-60}$ heteroarylene including one or more heteroatoms selected from the group consisting of N, O, and S.

According to another embodiment of the present invention, a photoresist pattern manufactured from the above-described positive photoresist composition is provided.

According to still another embodiment of the present invention, a method for manufacturing a photoresist pattern using the above-described positive photoresist composition is provided.

Hereinafter, a positive photoresist composition, a photoresist pattern manufactured from the composition, and a method for manufacturing the pattern according to specific embodiments of the present invention will be explained in detail.

Throughout the specification, (methyl)acrylate or (meth)acrylate means to include acryl and methacryl.

A chemical amplification type of photoresist composition for a thick film should have excellent properties such as solution stability, as well as excellent resistance to a plating solution, because the viscosity of the photoresist composition itself is very high.

The present inventors confirmed through experiments that a chemical amplification type of positive photoresist composition including an acrylic resin including a repeat unit of the following Chemical Formula 1, and a photosensitive acid-generating compound, has excellent storage stability and heat resistance, and a pattern formed using the photoresist composition has excellent sensitivity, developability, and resistance to a plating solution, and completed the invention.

Specifically, the positive photoresist composition of one embodiment includes an acrylic resin including a repeat unit of the following Chemical Formula 1, and a photosensitive acid-generating compound.

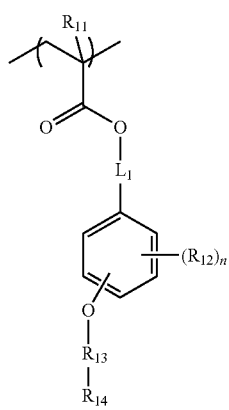

[Chemical Formula 1]

In Chemical Formula 1, $R_{11}$ and $R_{12}$ are each independently hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl including one or more heteroatoms selected from the group consisting of N, O, and S, n is 0 to 3, $R_{13}$ is a $C_2$~$C_8$ linear or branched alkylene, $R_{14}$ is a vinyl group or a (meth)acrylate group, and $L_1$ is a direct bond; a $C_1$~$C_{20}$ alkylene; a substituted or unsubstituted $C_{6-60}$ arylene; or a $C_{2-60}$ heteroarylene including one or more heteroatoms selected from the group consisting of N, O, and S.

The repeat unit of Chemical Formula 1 may be repeated one time to 1000 times.

Preferably, $R_{13}$ may be a $C_3$~$C_6$ branched alkylene.

Preferably, $R_{14}$ may be a vinyl group.

For example, the repeat unit of Chemical Formula 1 may be the following Chemical Formula 6.

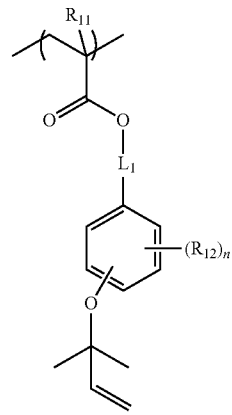

[Chemical Formula 6]

In Chemical Formula 6, $R_{11}$, $R_{12}$, n, and $L_1$ may be as defined as in Chemical Formula 1.

In the total amount of the acrylic resin, the content of the repeat unit represented by Chemical Formula 1 may be 10 to 90 wt %, 15 to 70 wt %, 20 to 60 wt %, or 20 to 50 wt %. If the content of the repeat unit represented by Chemical Formula 1 is less than 10 wt %, a developing speed on a developer may be slow and sensitivity may be lowered, and if it is greater than 90 wt %, the residual film rate of an unexposed region after developing may be too low and resistance to a plating solution may be deteriorated.

The acrylic resin included in the positive photoresist composition according to one embodiment of the present invention may include a repeat unit of the following Chemical Formula 2.

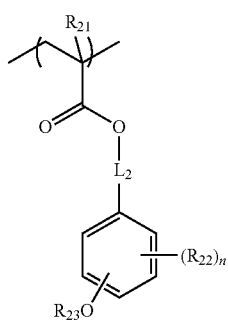

[Chemical Formula 2]

in Chemical Formula 2, $R_{21}$ and $R_{22}$ are each independently hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl including one or more heteroatoms selected from the group consisting of N, O, and S, n is 0 to 3, $L_2$ is a direct bond; a $C_1$~$C_{20}$ alkylene; a substituted or unsubstituted $C_{6-60}$ arylene; or a $C_{2-60}$ heteroarylene including one or more heteroatoms selected from the group consisting of N, O, and S, and $R_{23}$ is a substituted or unsubstituted $C_{1-60}$ alkyl; a substituted or unsubstituted $C_{1-60}$ alkyl-carbonyl; a substituted or unsubstituted $C_{3-60}$ cycloalkyl; a substituted or unsubstituted $C_{2-60}$ heterocycloalkyl including one or more heteroatoms selected from the group consisting of N, O, and S; a substituted or unsubstituted $C_{6-60}$ aryl; or a substituted or unsubstituted $C_{2-60}$ heteroaryl including one or more heteroatoms selected from the group consisting of N, O, and S.

The repeat unit of Chemical Formula 2 may be repeated one time to 1000 times.

In the total amount of the acrylic resin, the content of the repeat unit represented by Chemical Formula 2 may be 10 to 40 wt %, 15 to 30 wt %, or 15 to 20 wt %. If the content of the repeat unit represented by Chemical Formula 2 is less than 10 wt %, sensitivity may be lowered, and if it is greater than 40 wt %, storage stability may be deteriorated, or resistance to a plating solution may be deteriorated.

The acrylic resin may further include a repeat unit of the following Chemical Formula 3.

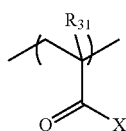

[Chemical Formula 3]

In Chemical Formula 3, $R_{31}$ is hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl including one or more heteroatoms selected from the group consisting of N, O, and S, and X is —OH.

The repeat unit of Chemical Formula 3 may be repeated one time to 1000 times.

The repeat unit of Chemical Formula 3 has an acid group, and due to the inclusion of the repeat unit of Chemical Formula 3 in the acrylic resin included in the photoresist composition according to one embodiment of the present invention, sensitivity may be improved, and developing speed may be easily controlled.

The repeat unit of Chemical Formula 3 may be, for example, one or more selected from the group consisting of methacrylic acid, acrylic acid, crotonic acid, itaconic acid, maleic acid, fumaric acid, citraconic acid, and mesaconic acid.

The content of the repeat unit represented by Chemical Formula 3 may be 5 to 20 wt %, 7 to 15 wt %, or 10 to 15 wt %, in the total amount of the acrylic resin. If the content of the repeat unit represented by Chemical Formula 3 in the total amount of the acrylic resin is less than 5 wt %, sensitivity may be deteriorated, and if it is greater than 20 wt %, it may be difficult to control a developing speed.

The acrylic resin further includes a repeat unit of the following Chemical Formula 4.

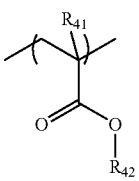

[Chemical Formula 4]

In Chemical Formula 4, $R_{41}$ is hydrogen; a substituted or unsubstituted $C_{1-60}$ alkyl; substituted or unsubstituted $C_{3-60}$ cycloalkyl; substituted or unsubstituted $C_{6-60}$ aryl; or a substituted or unsubstituted $C_{2-60}$ heteroaryl including one or more heteroatoms selected from the group consisting of N, O, and S, and $R_{42}$ is a $C_{1-5}$ alkyl substituted with a hydrophilic group; a $C_{1-5}$ alkyl-carbonyl unsubstituted or substituted with a hydrophilic group; a $C_{1-3}$ alkyl-ether unsubstituted or substituted with a hydrophilic group; a $C_{3-6}$ cycloalkyl substituted with a hydrophilic group; a $C_{2-6}$ heterocycloalkyl including one or more heteroatoms selected from the group consisting of N, O, and S, substituted with a hydrophilic group; a benzene substituted with a hydrophilic group; or a $C_{2-5}$ heteroaryl including one or more heteroatoms selected from the group consisting of N, O, and S, substituted with a hydrophilic group.

The repeat unit of Chemical Formula 4 may be repeated one time to 1000 times.

The repeat unit of Chemical Formula 4 has a hydrophilic group, and due to the inclusion of the repeat unit of Chemical Formula 4 in the acrylic resin included in the photoresist composition according to one embodiment of the present invention, wettability to a plating solution or a developer, and adhesion to a substrate, may be improved, and cracks of a photoresist pattern may be prevented.

The repeat unit of Chemical Formula 4 may be, for example, one or more selected from the group consisting of ethylene glycol methyl ether (meth)acrylate, 2-methoxyethyl methacrylate, 2-hydroxyethyl methacrylate, 2-hydroxypropyl methacrylate, 2-hydroxybutyl methacrylate, methoxypolyethylene glycol methacrylate, polyethylene glycol methacrylate, and polypropylene glycol methacrylate.

The content of the repeat unit represented by Chemical Formula 4 may be 10 to 50 wt %, 15 to 40 wt %, or 20 to 25 wt %, in the total amount of the acrylic resin. If the content of the repeat unit represented by Chemical Formula 4 in the total amount of the acrylic resin is less than 10 wt %, sensitivity may be deteriorated, and if it is greater than 50 wt %, resistance to a plating solution may be deteriorated, or it may be difficult to control a developing speed.

The acrylic resin may further include a repeat unit of the following Chemical Formula 5.

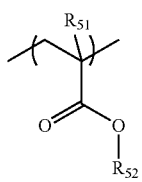

[Chemical Formula 5]

$R_{51}$ is hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl including one or more heteroatoms selected from the group consisting of N, O, and S, and $R_{52}$ is a substituted or unsubstituted $C_{20-60}$ alkyl; a $C_{5-60}$ cycloalkyl unsubstituted or substituted with a $C_{1-5}$ alkyl group; or a $C_{6-60}$ aryl unsubstituted or substituted with a $C_{1-5}$ alkyl group.

The repeat unit of Chemical Formula 5 may be repeated one time to 1000 times.

The repeat unit of Chemical Formula 5 has a hydrophobic group, and due to the inclusion of the repeat unit of Chemical Formula 5 in the acrylic resin included in the photoresist composition according to one embodiment of the present invention, resistance to a plating solution may be improved, thus preventing cracks or swelling of a photoresist pattern during plating.

The repeat unit of Chemical Formula 5 may be, for example, one or more selected from the group consisting of cyclohexyl (meth)acrylate, 1-methylcyclopentyl (meth)acrylate, 1-ethylcyclopentyl (meth)acrylate, 1-ethylcyclohexyl (meth)acrylate, 1-ethylcycloheptyl (meth)acrylate, 1-ethylcyclooctyl (meth)acrylate, 1-ethylcyclodecyl (meth)acrylate, 1-ethylcyclododecyl (meth)acrylate, 1-butyl cyclohexyl (meth)acrylate, 1-isopropylcycloheptyl (meth)acrylate, 2,5-dimethyl-1-methylcyclohexyl (meth)acrylate, dicyclopentanyl methacrylate, and isobornyl methacrylate.

The acrylic resin included in the positive photoresist composition according to one embodiment may include one or both of a dicyclopentanyl methacrylate and benzyl methacrylate repeating unit.

The content of the repeat unit represented by Chemical Formula 5 may be 10 to 50 wt %, 15 to 40 wt %, or 20 to 25 wt %, in the total amount of the acrylic resin. If the content of the repeat unit represented by Chemical Formula 5 in the total amount of the acrylic resin is less than 10 wt %, resistance to a plating solution may be deteriorated, and if it is greater than 50 wt %, sensitivity may be deteriorated, or it may be difficult to control a developing speed.

The acrylic resin may include one or more selected from the group consisting of the repeat unit of Chemical Formula 1, and the repeat units of Chemical Formulas 2 to 5. Further, the content of the repeat unit of Chemical Formula 1 may be 10 to 90 wt %, 15 to 70 wt %, 20 to 60 wt %, or 20 to 50 wt %, in the total amount of the acrylic resin.

The acrylic resin included in the positive photoresist composition according to one embodiment may be included in the content of 10 to 80 wt %, 20 to 75 wt %, 30 to 70 wt %, or 40 to 65 wt %, in the total amount of the photoresist composition. If the content of the acrylic resin is less than 10 wt %, adhesion to a substrate may be deteriorated due to too low viscosity of the composition, and thus it may be difficult to form a thick film photoresist layer, and if it is greater than 80 wt %, the viscosity of the composition may unnecessarily increase, thus rendering it difficult to form a coating with a uniform thickness, and to realize a smooth surface, and it may be difficult to form a resist layer with a desired thickness.

The acrylic resin of the present invention having the above-described characteristics may have a weight average molecular weight in the range of 20,000 to 400,000, 50,000 to 200,000, or 80,000 to 150,000. If the weight average molecular weight is less than 10,000, the properties of a film may become poor, and if it is greater than 300,000, solubility in a developer may be lowered. By controlling such weight average molecular weight, sufficient strength of a thick film photoresist layer may be maintained without deteriorating strippability from a support, and swelling of a profile or generation of cracks may be prevented during plating.

The positive photoresist composition according to one embodiment of the present invention may further include polyhydroxystyrene (PHS) resin. The content of the polyhydroxystyrene resin is preferably 10 to 30 wt %, or 15 to 25 wt %, based on the total amount of the photoresist composition.

The positive photoresist composition according to one embodiment of the present invention includes the photosensitive acid-generating compound, which may be, for example, one or more selected from the group consisting of triarylsulfonium salts, such as triphenylsulfonium triflate, triphenylsulfonium antimonate, diaryliodonium salts, such as diphenyliodonium triflate, diphenyliodonium antimonate, methoxyphenyl phenyliodonium triflate, di-t-butyliodonium triflate, and sulfonate compounds, such as 2,6-dinitrobenzyl sulfonate, pyrogallol tris(alkyl sulfonate), and succinimidyl triflate.

The positive photoresist composition may further include one or more selected from the group consisting of an acid diffusion control agent, a corrosion inhibitor, and a solvent.

The acid diffusion control agent may be added so as to improve resist pattern shape, stability after exposure, etc., and for example, may be one or more selected from the group consisting of triethylamine, tripropyl amine, tribenzylamine, trihydroxyethylamine, and ethylene diamine.

In order to control the viscosity of the photoresist composition, it is preferable to include a solvent, which may include, for example, a ketone such as acetone, methylethylketone, cyclohexanone, methyl isoamyl ketone, 2-heptanone, etc.; a polyhydric alcohol and a derivative thereof such as monomethyl ether, monoethyl ether, monopropyl ether, monobutyl ether, a monophenyl ether of ethylene glycol, ethylene glycol monoacetate, diethylene glycol, diethylene glycol monoacetate, propylene glycol, propylene glycol monoacetate, dipropylene glycol, dipropylene glycol monoacetate, etc.; a cyclic ether such as dioxane, etc.; an ester such as ethyl formate, methyl lactate, ethyl lactate, methyl acetate, ethyl acetate, butyl acetate, methyl pyruvate, methyl acetoacetate, ethyl acetoacetate, ethyl pyruvate, ethyl ethoxyacetate, methyl methoxypropionate, ethyl ethoxypropionate, methyl 2-hydroxypropionate, ethyl 2-hydroxypropionate, ethyl 2-hydroxy-2-methyl propionate, methyl 2-hydroxy-3-methylbutanoate, 3-methoxybutylacetate, 3-methyl-3-methoxybutyl acetate, etc.; and an aromatic hydrocarbon such as toluene, xylene, etc. They may be used alone, or in combinations of two or more kinds.

The photoresist pattern according to another embodiment of the present invention is manufactured from the above positive photoresist composition. It is preferable for the pattern to be a thick film with a thickness of 3 to 150 µm, 10 to 130 µm, 50 to 100 µm, or 60 to 80 µm. If the thickness of the pattern is less than 3 µm, it may be difficult to form a bump with an appropriate thickness, and if it is greater than 150 µm, it may be difficult to strip the photoresist (PR) pattern after plating.

The method for manufacturing a photoresist pattern according to still another embodiment of the present invention includes: a deposition process wherein a thick film photoresist layer consisting of the above-described positive photoresist composition is deposited on a support; an exposure process wherein radiation including electromagnetic waves or a corpuscular beam is irradiated to the thick film photoresist layer; and a development process wherein the thick film photoresist layer is developed after exposure to obtain a thick film resist pattern.

As the support, those conventionally known may be used without specific limitations. For example, substrates for electronic parts, substrates having a predetermined wiring pattern, etc., may be used. The substrate may be one made of a metal such as silicon, silicon nitride, titanium, tantalum, palladium, tungsten titanate, copper, chromium, iron, aluminum, etc., or a glass substrate, etc. As the material of the wiring pattern, copper, solder, chromium, aluminum, nickel, gold, etc. may be used.

First, in the deposition process, the photoresist composition is applied on a support, and a solvent is removed by heating (prebake), thereby forming a thick film photoresist layer. For the application on the support, spin coating, slit coating, roll coating, screen printing, an applicator method, etc. may be adopted.

According to the method for manufacturing a pattern of yet another embodiment of the present invention, it is preferable to deposit such that the pattern becomes a thick film with a thickness of 3 to 150 μm, 10 to 130 μm, 50 to 100 μm, or 60 to 80 μm. If the thickness of the pattern is less than 3 μm, it may be difficult to form a bump with an appropriate thickness, and if it is greater than 150 μm, it may be difficult to strip the photoresist (PR) pattern after plating.

Subsequently, in the exposure process, on the obtained thick film photoresist layer, radiation including electromagnetic waves or a corpuscular beam, for example, UV or visible light with a wavelength of 300~500 nm, is irradiated through a predetermined pattern mask.

As the source of radiation, a low pressure mercury lamp, a high pressure mercury lamp, an ultra-high pressure mercury lamp, a metal halide lamp, an argon gas laser, etc. may be used. Further, the radiation includes microwaves, infrared rays, visible light, UV, X-rays, y-rays, an electron beam, a proton beam, a neutron beam, an ion beam, etc. The amount of irradiation may vary according to the composition of the photoresist composition or the film thickness of the thick film photoresist layer, and for example, if an ultra-high pressure mercury lamp is used, it is 100~10,000 mJ/cm$^2$.

After exposure, the diffusion of acid is promoted by heating by a known method, thereby changing the alkali solubility of the thick film photoresist layer of the exposed part.

Subsequently, in the development process, for example, using a predetermined aqueous alkaline solution as a developer, unnecessary parts are dissolved and removed to obtain a predetermined thick film resist pattern.

As the developer, for example, an aqueous solution of alkali such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,0]-7-undecene, 1,5-diazabicyclo[4,3,0]-nonane, etc. may be used. An aqueous solution formed by adding an appropriate amount of water soluble organic solvents such as methanol, ethanol, etc. or a surfactant to the alkali aqueous solution, may be used as a developer.

A developing time may vary according to the composition of the photoresist composition or the film thickness of the thick film photoresist layer, and is commonly 1~30 minutes. A developing method may include liquid mounting, dipping, a paddle method, a spray developing method, etc.

After developing, washing in flowing water is conducted for 30~90 seconds, and drying is conducted using an air gun, oven, etc.

In the non-resist parts (parts removed with a developer) of the thick film resist pattern thus obtained, a conductor such as a metal, etc. is embedded by plating, thereby forming a terminal such as a bump, a metal post, etc. In addition, for the plating, various methods known in the prior art may be adopted without specific limitations. As the plating solution, particularly, solder plating, copper plating, gold plating, and nickel plating solutions are preferably used. The remaining thick film resist pattern is finally removed using a stripper by a predetermined method.

Advantageous Effects

According to the present invention, a positive photoresist composition having excellent storage stability, sensitivity, developability, resistance to a plating solution, and heat resistance, a thick film photoresist pattern manufactured therefrom, and a method for manufacturing a pattern, are provided.

Detailed Description of the Embodiments

The present invention will be explained in more detail in the following examples. However, these examples are presented only as the illustrations of the present invention, and the scope of the invention is not limited thereby.

SYNTHESIS EXAMPLE 1

40 g of 4-(2-methylbut-3-en-2-yloxy)phenyl methacrylate, 10 g of methacrylic acid, 20 g of 2-methoxyethyl methacrylate, and 30 g of cyclohexyl methacrylate were mixed with 150 g of PGMEA (propylene glycol methyl ether acetate), and the mixture was stirred at 50° C. to form a homogeneous solution. After nitrogen gas bubbling for 30 minutes, 4 g of AIBN was added, and with continuous nitrogen gas bubbling, polymerization was conducted for 7 hours while maintaining the reaction temperature at 70° C. After the polymerization was finished, the reaction solution was mixed with a large amount of hexane to solidify the produced polymer. Subsequently, operations of redissolving of the polymer in tetrahydrofuran, followed by resolidification by hexane, were repeated several times to remove non-reacted monomers, and drying at 50° C. under reduced pressure gave Acrylic Resin 1.

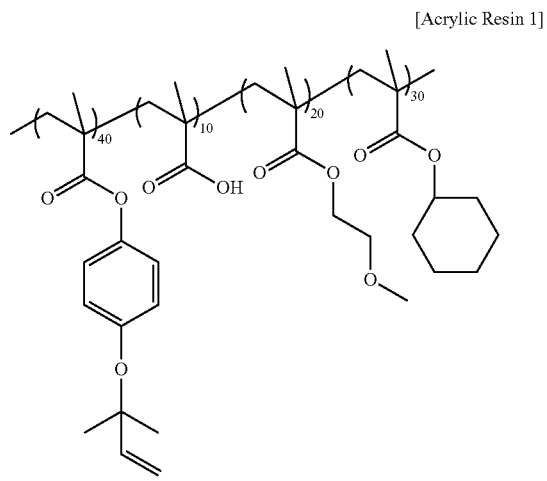

[Acrylic Resin 1]

SYNTHESIS EXAMPLE 2

The following Acrylic Resin 2 was obtained by the same method as Synthesis Example 1, except using 20 g of 4-(2-methylbut-3-en-2-yloxy)phenyl methacrylate, 20 g of 4-(tetrahydro-2H-pyran-2-yloxy)phenyl methacrylate, 10 g of methacrylic acid, 20 g of 2-methoxyethyl methacrylate, and 30 g of cyclohexyl methacrylate as raw materials.

[Acrylic Resin 2]

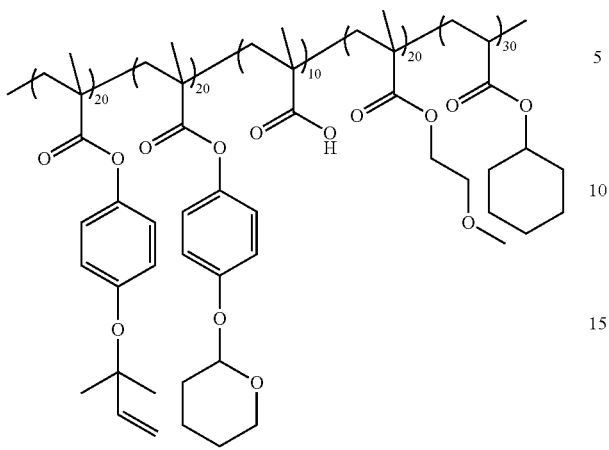

SYNTHESIS EXAMPLE 3

The following Acrylic Resin 3 was obtained by the same method as Synthesis Example 1, except using 40 g of 2-methylbut-3-en-2-yl methacrylate, 10 g of methacrylic acid, 20 g of 2-methoxyethyl methacrylate, and 30 g of cyclohexyl methacrylate as raw materials.

[Acrylic Resin 3]

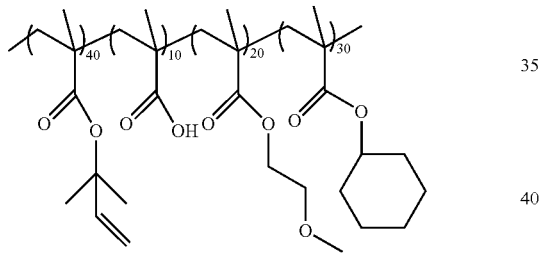

SYNTHESIS EXAMPLE 4

The following Acrylic Resin 4 was obtained by the same method as Synthesis Example 1, except using 40 g of 4-(tetrahydro-2H-pyran-2-yloxy) methacrylate, 10 g of methacrylic acid, 20 g of 2-methoxyethyl methacrylate, and 30 g of cyclohexyl methacrylate as raw materials.

[Acrylic Resin 4]

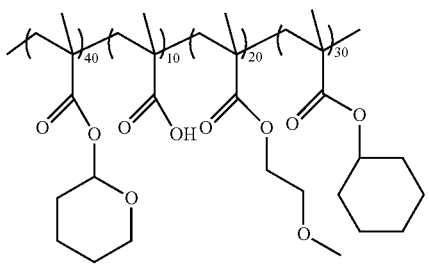

EXAMPLES 1 TO 4 AND COMPARATIVE EXAMPLES 1 TO 4

The positive photoresist compositions of Examples 1 to 4 and Comparative Examples 1 to 4 were prepared with the components and contents described in the following Table 1. Here, PHS is a compound represented by the following Chemical Formula 9, PAG is a photosensitive acid-generating compound, and Quencher is an acid diffusion inhibition agent.

[Chemical Formula 9]

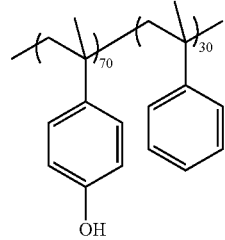

TABLE 1

|  | Example 1 | Example 2 | Example 3 | Example 4 | Comparative Example 1 | Comparative Example 2 | Comparative Example 3 | Comparative Example 4 |
|---|---|---|---|---|---|---|---|---|
| Acrylic resin 1 | 80 | 100 |  |  |  |  |  |  |
| Acrylic resin 2 |  |  | 80 | 100 |  |  |  |  |
| Acrylic resin 3 |  |  |  |  | 80 | 100 |  |  |
| Acrylic resin 4 |  |  |  |  |  |  | 80 | 100 |
| PHS resin | 20 |  | 20 |  | 20 |  | 20 |  |
| PAG | 3 | 3 | 3 | 3 | 3 | 3 | 3 | 3 |
| Quencher | 0.1 | 0.1 | 0.1 | 0.1 | 0.1 | 0.1 | 0.1 | 0.1 |

※ The contents of the components described in Table 1 are based on solid contents, the sum of an acrylic resin and the PHS resin is 100 parts by weight, and the contents of PAG and Quencher are 3 parts by weight and 0.1 parts by weight, respectively, based on a total of 100 parts by weight of the acrylic resin and the PHS resin.

Evaluation
(1) Storage Stability

An acceleration test was progressed by storing the photoresist compositions prepared in Examples 1 to 4 and Comparative Examples 1 to 4 in an oven at 60° C. for one week, the exposure energy was measured, and then storage stability was evaluated according to the following standard. The results are shown in Table 2.

⊚: Exposure energy (EOP) change rate is 1% or less
○: EOP change rate is greater than 1% and 5% or less
Δ: EOP change rate is greater than 5% and 10% or less
X: EOP change rate is greater than 10%

(2) Sensitivity

The photoresist compositions prepared in Examples 1 to 4 and Comparative Examples 1 to 4 were spin coated on a glass substrate, dried at 120° C. for 2 minutes on a hot plate, and then exposed using a step mask, additionally dried at 100° C. for 2 minutes on a hot plate, and developed in an aqueous solution of TMAH (tetramethylammonium hydroxide). The exposure amount at which the CD's of the step mask pattern and the photoresist (PR) pattern are identical was evaluated as sensitivity. The results are shown in Table 2.

(3) Developability

The photoresist compositions prepared in Examples 1 to 4 and Comparative Examples 1 to 4 were spin coated on a glass substrate, dried at 120° C. for 2 minutes on a hot plate, and then exposed using a step mask, additionally dried at 100° C. for 2 minutes on a hot plate, and developed in an aqueous solution of TMAH (tetramethylammonium hydroxide). A value that is decreased from the hole diameter of the top to the hole diameter of the bottom of the thick film resist pattern was measured as a footing length, and it was used as an indicator of developability. The developability was measured based on the following standard, and the results are shown in Table 2.

⊚: The footing length is greater than 0 nm and 200 nm or less
○: The footing length is greater than 200 nm and 500 nm or less
Δ: The footing length is greater than 500 nm and 1 μm or less
X: The footing length is greater than 1 μm (4) Resistance to a Plating Solution The resist films formed by applying the photoresist compositions prepared in Examples 1 to 4 and Comparative Examples 1 to 4 on a substrate using a spin coater, followed by prebake and postbake, were soaked in a Cu plating solution at room temperature for 2 hours, and then it was observed whether the thickness of the resist films changed. The thickness change rate was measured based on the following standard, and the results are shown in Table 2.

⊚: The thickness change rate is 1% or less
○: The thickness change rate is greater than 1% and 5% or less
Δ: The thickness change rate is greater than 5% and 10% or less
X: The thickness change rate is greater than 10%

(5) Heat Resistance

The photoresist compositions prepared in Examples 1 to 4 and Comparative Examples 1 to 4 were spin coated on a glass substrate, dried at 120° C. for 2 minutes on a hot plate, and then exposed using a step mask and additionally dried at 100° C. for 2 minutes on a hot plate. Thereafter, the coated wafer was tilted to 45° for 20 seconds, and developed in an aqueous solution of TMAH (tetramethylammonium hydroxide). It was measured how the manufactured thick film resist pattern was tilted aside (verticality of pattern slope) to evaluate heat resistance, and the results are shown in Table 2, based on the following standard.

⊚: Not tilted
○: greater than 0° and 5° or less
Δ: greater than 5° and 10° or less
X: greater than 10°

TABLE 2

| | Storage stability | Sensitivity (exposure amount, mJ/cm$^2$) | Developability | Resistance to a plating solution | Heat resistance |
|---|---|---|---|---|---|
| Example 1 | ⊚ | 280 | ⊚ | ⊚ | ⊚ |
| Example 2 | ⊚ | 350 | ○ | ⊚ | ○ |
| Example 3 | ⊚ | 160 | ⊚ | ○ | ⊚ |
| Example 4 | ⊚ | 200 | ⊚ | ○ | ○ |
| Comparative Example 1 | Δ | 560 | X | ○ | Δ |
| Comparative Example 2 | Δ | 990 | X | ○ | Δ |
| Comparative Example 3 | X | 520 | Δ | Δ | X |
| Comparative Example 4 | X | 760 | Δ | X | X |

According to Table 2, it is confirmed that Examples 1 to 4 including Acrylic Resin 1 or 2 exhibited remarkably excellent storage stability, sensitivity, developability, plating solution resistance, and heat resistance, compared to Comparative Examples 1 to 4 including Acrylic Resin 3 or 4.

What is claimed is:

1. A positive photoresist composition comprising: an acrylic resin comprising a repeat unit of the following Chemical Formula 1; a polyhydroxystyrene (PHS) resin; and a photosensitive acid-generating compound,
wherein the composition comprises the polyhydroxystyrene (PHS) resin in the amount of 10 to 30 wt % based on the total amount of the photoresist composition:

[Chemical Formula 1]

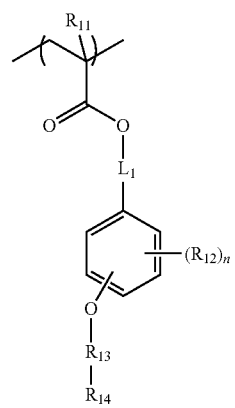

wherein, in Chemical Formula 1,
$R_{11}$ and $R_{12}$ are each independently hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl comprising one or more heteroatoms selected from the group consisting of N, O, and S,
n is 0 to 3,
$R_{13}$ is a $C_3$~$C_6$ branched alkylene,
$R_{14}$ is a vinyl group, and
$L_1$ is a direct bond; a $C_1$~$C_{20}$ alkylene; a substituted or unsubstituted $C_{6-60}$ arylene; or a $C_{2-60}$ heteroarylene comprising one or more heteroatoms selected from the group consisting of N, O, and S.

2. The positive photoresist composition according to claim 1, wherein the repeat unit of Chemical Formula 1 is included in the content of 10 to 90 wt %, based on the total amount of the acrylic resin.

3. The positive photoresist composition according to claim 1, wherein the acrylic resin further comprises a repeat unit of the following Chemical Formula 2:

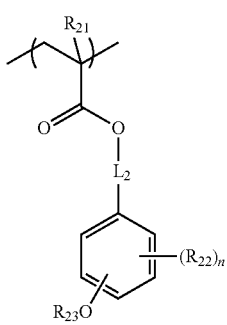

[Chemical Formula 2]

wherein, in Chemical Formula 2, $R_{21}$ and $R_{22}$ are each independently hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl comprising one or more heteroatoms selected from the group consisting of N, O, and S, n is 0 to 3, $L_2$ is a direct bond; a $C_1$–$C_{20}$ alkylene; a substituted or unsubstituted $C_{6-60}$ arylene; or a $C_{2-60}$ heteroarylene comprising one or more heteroatoms selected from the group consisting of N, O, and S, and $R_{23}$ is a substituted or unsubstituted $C_{1-60}$ alkyl; a substituted or unsubstituted $C_{1-60}$ alkyl-carbonyl; a substituted or unsubstituted $C_{3-60}$ cycloalkyl; a substituted or unsubstituted $C_{2-60}$ heterocycloalkyl comprising one or more heteroatoms selected from the group consisting of N, O, and S; a substituted or unsubstituted $C_{6-60}$ aryl; or a substituted or unsubstituted $C_{2-60}$ heteroaryl comprising one or more heteroatoms selected from the group consisting of N, O, and S.

4. The positive photoresist composition according to claim 3, wherein the repeat unit of Chemical Formula 2 is included in the content of 10 to 40 wt %, based on the total amount of the acrylic resin.

5. The positive photoresist composition according to claim 1, wherein the acrylic resin further comprises a repeat unit of the following Chemical Formula 3:

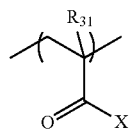

[Chemical Formula 3]

wherein, in Chemical Formula 3, $R_{31}$ is hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl comprising one or more heteroatoms selected from the group consisting of N, O, and S, and X is —OH.

6. The positive photoresist composition according to claim 5, wherein the repeat unit of Chemical Formula 3 is included in the content of 5 to 20 wt %, based on the total amount of the acrylic resin.

7. The positive photoresist composition according to claim 1, wherein the acrylic resin further comprises a repeat unit of the following Chemical Formula 4:

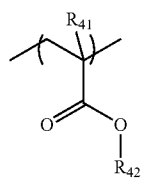

[Chemical Formula 4]

wherein, in Chemical Formula 4, $R_{41}$ is hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl comprising one or more heteroatoms selected from the group consisting of N, O, and S, and $R_{42}$ is a $C_{1-5}$ alkyl substituted with a hydrophilic group; a $C_{1-5}$ alkyl-carbonyl unsubstituted or substituted with a hydrophilic group; a $C_{1-3}$ alkyl-ether unsubstituted or substituted with a hydrophilic group; a $C_{3-6}$ cycloalkyl substituted with a hydrophilic group; a $C_{2-6}$ heterocycloalkyl comprising one or more heteroatoms selected from the group consisting of N, O, and S, substituted with a hydrophilic group; benzene substituted with a hydrophilic group; or a $C_{2-5}$ heteroaryl comprising one or more heteroatoms selected from the group consisting of N, O, and S, substituted with a hydrophilic group.

8. The positive photoresist composition according to claim 7, wherein the repeat unit of Chemical Formula 4 is included in the content of 10 to 50 wt %, based on the total amount of the acrylic resin.

9. The positive photoresist composition according to claim 1, wherein the acrylic resin further comprises a repeat unit of the following Chemical Formula 5:

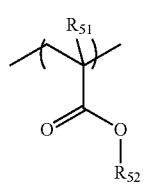

[Chemical Formula 5]

wherein, in Chemical Formula 5, $R_{51}$ is hydrogen; a substituted or unsubstituted $C_{1-60}$ alkyl; a substituted or unsubstituted $C_{3-60}$ cycloalkyl; a substituted or unsubstituted $C_{6-60}$ aryl; or a substituted or unsubstituted $C_{2-60}$ heteroaryl comprising one or more heteroatoms selected from the group consisting of N, O, and S, and $R_{52}$ is a substituted or unsubstituted $C_{20-60}$ alkyl; a $C_{5-60}$ cycloalkyl unsubstituted or substituted with a $C_{1-5}$ alkyl group; or a $C_{6-60}$ aryl unsubstituted or substituted with a $C_{1-5}$ alkyl group.

10. The positive photoresist composition according to claim 9, wherein the repeat unit of Chemical Formula 5 is included in the content of 10 to 50 wt %, based on the total amount of the acrylic resin.

11. The positive photoresist composition according to claim 1, wherein the acrylic resin is included in the content of 3 to 60 wt %, based on the total amount of the positive photoresist composition.

12. The positive photoresist composition according to claim 1, wherein the photosensitive acid-generating compound is one or more selected from the group consisting of triarylsulfonium salts, diaryliodonium salts, sulfonate compounds, di-t-butyliodonium triflate, and succinimidyl triflate.

13. The positive photoresist composition according to claim 1, further comprising one or more selected from the group consisting of an acid diffusion control agent, a corrosion inhibitor, and a solvent.

14. The positive photoresist composition according to claim 13, wherein the acid diffusion control agent is one or more selected from the group consisting of triethylamine, tripropyl amine, tribenzyl amine, trihydroxyethyl amine, and ethylene diamine.

15. A photoresist pattern manufactured from the positive photoresist composition according to claim 1.

16. The photoresist pattern according to claim 15, wherein the photoresist pattern has a thickness of 3 to 150 µm.

17. A method for manufacturing a photoresist pattern, comprising: a deposition process wherein a thick film photoresist layer consisting of the positive photoresist composition described in claim 1 is deposited on a support;

an exposure process wherein radiation comprising electromagnetic waves or a corpuscular beam is irradiated to the thick film photoresist layer; and a development process wherein the exposed thick film photoresist layer is developed to obtain a thick film resist pattern.

18. The method for manufacturing a photoresist pattern according to claim 17, wherein, in the deposition process, the thick film photoresist layer is deposited to a thickness of 3 to 150 µm.

* * * * *